(12) United States Patent
Suzuya et al.

(10) Patent No.: US 8,633,602 B2
(45) Date of Patent: Jan. 21, 2014

(54) SEMICONDUCTOR DEVICE, AND METHOD AND APPARATUS FOR MANUFACTURING THE SAME

(75) Inventors: Nobuhito Suzuya, Kawasaki (JP); Atsushi Yoshimura, Yokkaichi (JP); Hideko Mukaida, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,126

(22) Filed: Mar. 15, 2012

(65) Prior Publication Data
US 2012/0326339 A1 Dec. 27, 2012

(30) Foreign Application Priority Data
Jun. 24, 2011 (JP) .................................. 2011-140847

(51) Int. Cl.
*H01L 21/00* (2006.01)
*H01L 23/29* (2006.01)

(52) U.S. Cl.
USPC ........... 257/789; 438/106; 438/109; 438/124; 438/126; 438/127

(58) Field of Classification Search
USPC ........................ 438/106–121; 257/787–797
See application file for complete search history.

(56) References Cited

U.S. PATENT DOCUMENTS

| | | | | |
|---|---|---|---|---|
| 5,313,365 | A * | 5/1994 | Pennisi et al. | 361/760 |
| 5,436,203 | A * | 7/1995 | Lin | 29/841 |
| 6,833,287 | B1 * | 12/2004 | Hur et al. | 438/107 |
| 7,218,006 | B2 * | 5/2007 | Kang et al. | 257/777 |

FOREIGN PATENT DOCUMENTS

JP 2010-118669 5/2010

* cited by examiner

*Primary Examiner* — Seahvosh Nikmanesh
*Assistant Examiner* — Evren Seven
(74) *Attorney, Agent, or Firm* — Oblon, Spivak, McClelland, Maier & Neustadt, L.L.P.

(57) ABSTRACT

According to one embodiment, a manufacturing method of a semiconductor device is disclosed. The method includes: stacking and adhering a second semiconductor chip on a first semiconductor chip via an adhesive layer; adjusting at least one of an elasticity modulus of the adhesive layer, a sink amount of the adhesive layer, a thickness of a protective film at a surface of the first chip, and an elasticity modulus of the protective film such that "y" in a following formula is 70 or less; and sealing the chips by a molding resin with filler particles.

$$y = 74.7 - 82.7a_1 + 273.2a_2 - 9882a_3 + 65.8a_4$$

a1: a logarithm of the modulus of elasticity [MPa] of the adhesive layer
a2: the sink amount [mm] of the adhesive layer
a3: the thickness [mm] of the protective film
a4: a logarithm of the modulus of elasticity [MPa] of the protective film.

5 Claims, 3 Drawing Sheets

US 8,633,602 B2

SEMICONDUCTOR DEVICE, AND METHOD AND APPARATUS FOR MANUFACTURING THE SAME

CROSS-REFERENCE TO RELATED APPLICATION

This application is based upon and claims the benefit of priority from the prior Japanese Patent Application No. 2011-140847, filed on Jun. 24, 2011; the entire contents of which are incorporated herein by reference.

FIELD

Embodiments described herein relate generally to a semiconductor device, and a method and an apparatus for manufacturing the same.

BACKGROUND

Conventionally, in a manufacturing process of a semiconductor device in which plural semiconductor chips are stacked and sealed by a molding resin, there is a case when so-called "a filler attack" occurs in which filler particles contained in a molding resin are pushed into between a lower semiconductor chip and an upper semiconductor chip and a gap at a periphery of an adhesive layer adhering the semiconductor chips, and the lower semiconductor chip, particularly a passivation film under a protective film at a surface thereof is damaged.

Namely, the semiconductor device is generally manufactured by forming an adhesive layer with a liquid resin, a die attachment film (DAF), and so on at a rear surface of a semiconductor wafer, and thereafter, separating into semiconductor chips, stacking the obtained semiconductor chips with the adhesive layer on a substrate or a semiconductor chip, and then sealing with the molding resin. According to this method, there is a case when a "sink" in which an outer edge part of the adhesive layer formed at the rear surface is set back toward an inner side from a sidewall of the semiconductor chip caused by a mechanical damage and so on of the adhesive layer when the semiconductor wafer is separated into the semiconductor chips. When stacking the semiconductor chips, the "sink" becomes the gap where the filler particles are pushed in to be a factor of occurrence of the filler attack.

DETAILED DESCRIPTION

Figure 1:
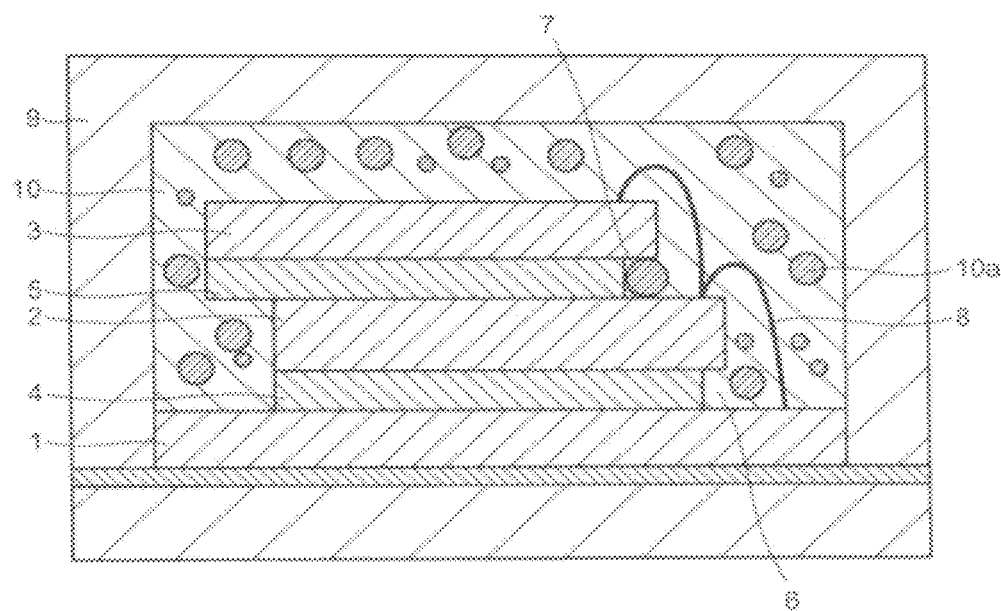
FIG. 1 is a schematic sectional view illustrating a manufacturing process of a semiconductor device according to an embodiment.

In general, according to one embodiment, a manufacturing method of a semiconductor device is disclosed. This method includes: (a) stacking and adhering a second semiconductor chip on a first semiconductor chip via an adhesive layer; (b) adjusting at least one of a modulus of elasticity [MPa] of the adhesive layer, a sink amount [mm] of the adhesive layer, a thickness [mm] of a protective film at a surface of the first semiconductor chip, and a modulus of elasticity [MPa] of the protective film at the surface of the first semiconductor chip to such that a value of "y" determined by a following formula (1) is 70 or less; and (c) sealing the first and second semiconductor chips by a molding resin with filler particles.

$$y = 74.7 - 82.7a1 + 273.2a2 - 9882a3 + 65.8a4 \quad (1)$$

In the formula (1) a1 represents a logarithm of the modulus of elasticity [MPa] of the adhesive layer, a2 represents the sink amount [mm] of the adhesive layer, a3 represents the thickness [mm] of a protective film at the surface of the first semiconductor chip, and a4 represents a logarithm of the modulus of elasticity [MPa] of the protective film at the surface of the first semiconductor chip. As used herein, the term "modulus of elasticity" means, unless expressly stated otherwise, modulus of elasticity at the temperature of a molding resin with filler particles sealing the first and second semiconductor chips.

According to another embodiment, a manufacturing apparatus of a semiconductor device is disclosed. The apparatus is the manufacturing apparatus of the semiconductor device including a first semiconductor chip, a second semiconductor chip stacked on the first semiconductor chip via an adhesive layer; and a molding resin with filler particles sealing the first and second semiconductor chips. The apparatus includes an adjusting part adjusting at least one of a modulus of elasticity [MPa] of the adhesive layer, a sink amount [mm] of the adhesive layer, a thickness [mm] of a protective film at a surface of the first semiconductor chip, and a modulus of elasticity [MPa] of the protective film at the surface of the first semiconductor chip such that a value of "y" determined by the above-stated formula (1) is 70 or less.

According to another embodiment, a semiconductor device is disclosed. This device is a semiconductor device including: a first semiconductor chip; a second semiconductor chip stacked on the first semiconductor chip via an adhesive layer; and a molding resin with filler particles sealing the first and second semiconductor chips. In this device, the value of "y" determined by the above-stated formula (1) is 70 or less Hereinafter, embodiments are described with reference to the drawings. Note that in the description of the drawings, the same elements and elements having the same functions are designated the same reference numerals, and thereby duplicating explanations are not given.

FIG. 1 is a sectional view illustrating a semiconductor device in a process manufactured by a manufacturing method of a semiconductor device according to one embodiment. Note that a case when a semiconductor device stacking two semiconductor chips is formed as a multi stack mold sealing type semiconductor device is described in the present embodiment, but the number of the stacked semiconductor chips is not particularly limited.

In the present embodiment, at first, a first semiconductor chip 2 and a second semiconductor chip 3 are sequentially stacked on a substrate 1. Semiconductor elements are formed at the first semiconductor chip 2 and the second semiconductor chip 3, and a protective film is formed at each surface. Adhesive layers 4, 5 are respectively formed at rear surfaces of the first semiconductor chip 2 and the second semiconductor chip 3 in advance, the first semiconductor chip 2 and the substrate 1 are bonded via the adhesive layer 4. The first semiconductor chip 2 and the second semiconductor chip 3 are bonded via the adhesive layer 5. "Sinks" occur at each of the adhesive layers 4, 5 during a process separating the semiconductor wafer into the semiconductor chips 2, 3, and therefore, gaps 6, 7 are generated at peripheries of each of the adhesive layers 4, 5.

Next, an electrode on the substrate 1 and an electrode on the first semiconductor chip 2, and the electrode of the first semiconductor chip 2 and an electrode of the second semiconductor chip 3 are electrically connected by bonding wires 8. After that, those are housed in a molding metal die 9, a thermosetting resin such as an epoxy resin with filler particles 10a is injected in the metal die 9 as a molding resin 10, and the molding resin 10 is cured while dwelling at a constant pressure and heating inside the metal die 9.

Conventionally, the filler particles 10a in the molding resin 10 are pushed into gaps 7 generated at a periphery of the adhesive layer 5 intervening between the first semiconductor chip 2 and the second semiconductor chip 3 during the process injecting and curing the molding resin 10, and thereby, there is a case when a filler attack damaging a passivation film under a protective film at a surface of the first semiconductor chip 2 occurs.

However, in the present embodiment, at least one of a modulus of elasticity [MPa] of the adhesive layer 5, a sink amount [mm] of the adhesive layer 5, a thickness [mm] of the protective film at the surface of the first semiconductor chip 2, and a modulus of elasticity [MPa] of the protective film at the surface of the first semiconductor chip 2 is adjusted such that a value of "y" determined by the following formula (1) becomes 70 or less before the injection of the molding resin 10, and therefore, the filler attack does not occur as in the conventional method.

$$y = 74.7 - 82.7a1 + 273.2a2 - 9882a3 + 65.8a4 \quad (1)$$

In the formula (1), "a1" represents a logarithm of the modulus of elasticity [MPa] of the adhesive layer 5, "a2" represents the sink amount [mm] of the adhesive layer 5, "a3" represents the thickness [mm] of the protective film at the surface of the first semiconductor chip 2, and "a4" represents a logarithm of the modulus of elasticity [MPa] of the protective film at the surface of the first semiconductor chip 2.

Note that the sink amount a2 of the adhesive layer 5 means a maximum value of a distance from a sidewall surface of the second semiconductor chip 3 to an end part of the adhesive layer 5.

In the present embodiment, it is derived from experiments and so on performed by the present inventors that the filler attack can be prevented by adjusting at least one of the modulus of elasticity [MPa] of the adhesive layer 5, the sink amount [mm] of the adhesive layer 5, the thickness [mm] of the protective film at the surface of the first semiconductor chip 2, and the modulus of elasticity [MPa] of the protective film at the surface of the first semiconductor chip 2 such that the value of "y" determined by the above-stated formula (1) becomes 70 or less. Hereinafter, the details will be described.

A reason why the damage occurs at the passivation film under the protective film at the surface of the first semiconductor chip 2 caused by the filler particles 10a in the molding resin 10 in a manufacturing process of the multi stack mold sealing type semiconductor device, namely, a reason why the filler attack occurs is because a stress applied on the passivation film under the protective film just under the filler particle 10a at a sealing time by the molding resin 10 exceeds a threshold value and damages the protective film. Accordingly, it is expected that the occurrence of the filler attack is suppressed and the manufacturing of the semiconductor device with high yield becomes possible by performing proper design and manufacturing if a relationship between the stress applied on the passivation film under the protective film just under the filler particle 10a and design factors (a size, physical property values of composing materials and so on) of the semiconductor device can be found.

Accordingly, a stress analysis by means of a finite element method is performed to make the relationship between the stress applied on the passivation film under the protective film just under the filler particle 10a and the design factors of the semiconductor device clear.

Figure 2:
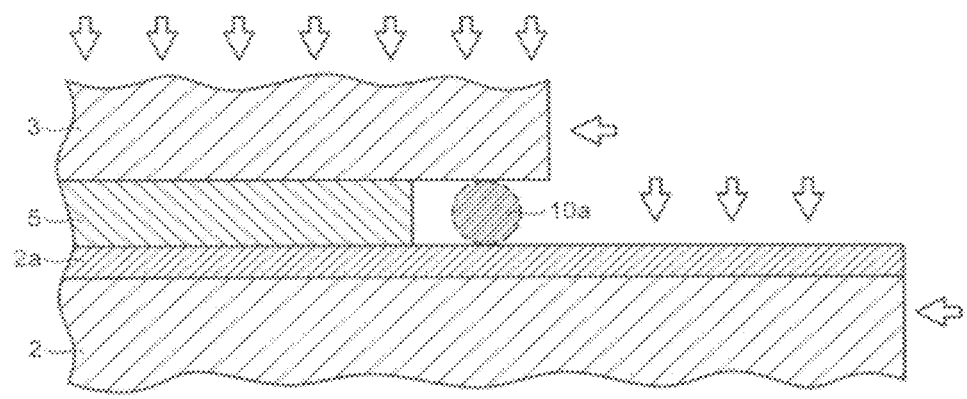
FIG. 2 is a sectional view illustrating a simulation model in the embodiment.
Figure 3:
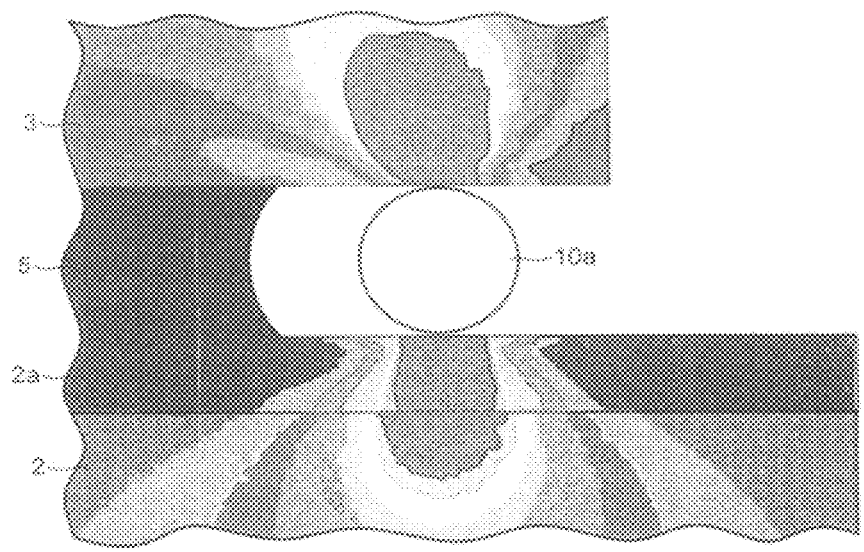
FIG. 3 is a view illustrating an example of a stress distribution in a vicinity of a filler particle in the simulation model illustrated in FIG. 2.

A simulation model is illustrated in FIG. 2. The model is made up of the first (first-stage) semiconductor chip 2 (thickness: 80 µm, modulus of elasticity 166.7 GPa), the second (second-stage) semiconductor chip 3 (thickness: 50 µm, modulus of elasticity 166.7 GPa), the adhesive layer 5 (thickness: 10 µm, sink: 20 µm, modulus of elasticity: 10 MPa), and a spherical filler particle 10a (diameter: 10 µm), and the spherical filler particle 10a positions at 10 µm from an end part of the sink of the adhesive layer 5. Besides, a protective film 2a at the surface of the first-stage semiconductor chip 2 has a modulus of elasticity of 3 GPa, and a thickness of 3 µm. A stress applied on the surface of the semiconductor chip 2 under the protective film 2a just under the filler particle 10a of the first-stage semiconductor chip 2 is calculated by uniformly applying a pressure of 10 MPa for the model as stated above as illustrated by arrows in FIG. 2. An example of an analysis result (a stress distribution in a vicinity of the filler particle at a pressure dwelling time) is illustrated in FIG. 3.

Note that a defect actually seen is a breakage of the passivation film, but the passivation film is very thin. Accordingly, the passivation film is not illustrated in the model for simplification. In the present experiment, the threshold value reaching the filler attack, namely the breakage of the passivation film is judged by the stress applied on the surface of the first-stage semiconductor chip 2 just under the filler particle 10a.

Next, evaluation factors are set to be four factors of (i) the modulus of elasticity of the adhesive layer, (ii) the sink amount of the adhesive layer, (iii) the thickness of the second-stage semiconductor chip, and (iv) the thickness of the first-stage semiconductor chip, and factorial experiments based on each three-level L81 orthogonal array are performed. Results are as represented in Table 1, and as a result of an analysis of variance, it turns out that it is advantageous as (i) the modulus of elasticity of the adhesive layer is higher, (ii) the sink amount of the adhesive layer is smaller, (iii) the thickness of the second-stage semiconductor chip is thinner, and there is no significant difference depending on (iv) the thickness of the first-stage semiconductor chip to reduce the stress applied on the surface of the semiconductor chip just under the filler particle.

TABLE 1

| No. | MODULUS OF ELASTICITY OF ADHESIVE LAYER [MPa] | SINK AMOUNT OF ADHESIVE LAYER [mm] | THICKNESS OF UPPER CHIP [mm] | THICKNESS OF LOWER CHIP [mm] | STRESS [MPa] |
|---|---|---|---|---|---|
| 1 | 10 | 0.02 | 0.02 | 0.03 | 75.2 |
| 2 | 10 | 0.02 | 0.02 | 0.055 | 73.1 |
| 3 | 10 | 0.02 | 0.02 | 0.08 | 72.2 |
| 4 | 10 | 0.02 | 0.05 | 0.03 | 128.7 |
| 5 | 10 | 0.02 | 0.05 | 0.055 | 125.6 |
| 6 | 10 | 0.02 | 0.05 | 0.08 | 123.8 |
| 7 | 10 | 0.02 | 0.1 | 0.03 | 234.4 |

TABLE 1-continued

| No. | MODULUS OF ELASTICITY OF ADHESIVE LAYER [MPa] | SINK AMOUNT OF ADHESIVE LAYER [mm] | THICKNESS OF UPPER CHIP [mm] | THICKNESS OF LOWER CHIP [mm] | STRESS [MPa] |
|---|---|---|---|---|---|
| 8 | 10 | 0.02 | 0.1 | 0.055 | 225.5 |
| 9 | 10 | 0.02 | 0.1 | 0.08 | 222.1 |
| 10 | 10 | 0.1 | 0.02 | 0.03 | 100.6 |
| 11 | 10 | 0.1 | 0.02 | 0.055 | 97.2 |
| 12 | 10 | 0.1 | 0.02 | 0.08 | 96.2 |
| 13 | 10 | 0.1 | 0.05 | 0.03 | 151.7 |
| 14 | 10 | 0.1 | 0.05 | 0.055 | 147.4 |
| 15 | 10 | 0.1 | 0.05 | 0.08 | 145.7 |
| 16 | 10 | 0.1 | 0.1 | 0.03 | 252.1 |
| 17 | 10 | 0.1 | 0.1 | 0.055 | 241.3 |
| 18 | 10 | 0.1 | 0.1 | 0.08 | 238.6 |
| 19 | 10 | 0.2 | 0.02 | 0.03 | 140.1 |
| 20 | 10 | 0.2 | 0.02 | 0.055 | 135.3 |
| 21 | 10 | 0.2 | 0.02 | 0.08 | 133.5 |
| 22 | 10 | 0.2 | 0.05 | 0.03 | 184.8 |
| 23 | 10 | 0.2 | 0.05 | 0.055 | 178.3 |
| 24 | 10 | 0.2 | 0.05 | 0.08 | 176.0 |
| 25 | 10 | 0.2 | 0.1 | 0.03 | 279.6 |
| 26 | 10 | 0.2 | 0.1 | 0.055 | 268.9 |
| 27 | 10 | 0.2 | 0.1 | 0.08 | 265.8 |
| 28 | 50 | 0.02 | 0.02 | 0.03 | 47.7 |
| 29 | 50 | 0.02 | 0.02 | 0.055 | 46.8 |
| 30 | 50 | 0.02 | 0.02 | 0.08 | 46.5 |
| 31 | 50 | 0.02 | 0.05 | 0.03 | 73.1 |
| 32 | 50 | 0.02 | 0.05 | 0.055 | 70.9 |
| 33 | 50 | 0.02 | 0.05 | 0.08 | 70.3 |
| 34 | 50 | 0.02 | 0.1 | 0.03 | 99.2 |
| 35 | 50 | 0.02 | 0.1 | 0.055 | 95.9 |
| 36 | 50 | 0.02 | 0.1 | 0.08 | 94.6 |
| 37 | 50 | 0.1 | 0.02 | 0.03 | 78.7 |
| 38 | 50 | 0.1 | 0.02 | 0.055 | 76.4 |
| 39 | 50 | 0.1 | 0.02 | 0.08 | 76.0 |
| 40 | 50 | 0.1 | 0.05 | 0.03 | 101.8 |
| 41 | 50 | 0.1 | 0.05 | 0.055 | 98.9 |
| 42 | 50 | 0.1 | 0.05 | 0.08 | 98.1 |
| 43 | 50 | 0.1 | 0.1 | 0.03 | 129.9 |
| 44 | 50 | 0.1 | 0.1 | 0.055 | 124.8 |
| 45 | 50 | 0.1 | 0.1 | 0.08 | 123.6 |
| 46 | 50 | 0.2 | 0.02 | 0.03 | 122.3 |
| 47 | 50 | 0.2 | 0.02 | 0.055 | 118.3 |
| 48 | 50 | 0.2 | 0.02 | 0.08 | 116.8 |
| 49 | 50 | 0.2 | 0.05 | 0.03 | 145.7 |
| 50 | 50 | 0.2 | 0.05 | 0.055 | 140.3 |
| 51 | 50 | 0.2 | 0.05 | 0.08 | 138.5 |
| 52 | 50 | 0.2 | 0.1 | 0.03 | 170.4 |
| 53 | 50 | 0.2 | 0.1 | 0.055 | 163.9 |
| 54 | 50 | 0.2 | 0.1 | 0.08 | 162.1 |
| 55 | 300 | 0.02 | 0.02 | 0.03 | 23.4 |
| 56 | 300 | 0.02 | 0.02 | 0.055 | 23.4 |
| 57 | 300 | 0.02 | 0.02 | 0.08 | 23.4 |
| 58 | 300 | 0.02 | 0.05 | 0.03 | 20.0 |
| 59 | 300 | 0.02 | 0.05 | 0.055 | 19.9 |
| 60 | 300 | 0.02 | 0.05 | 0.08 | 20.0 |
| 61 | 300 | 0.02 | 0.1 | 0.03 | 22.5 |
| 62 | 300 | 0.02 | 0.1 | 0.055 | 22.1 |
| 63 | 300 | 0.02 | 0.1 | 0.08 | 22.0 |
| 64 | 300 | 0.1 | 0.02 | 0.03 | 64.9 |
| 65 | 300 | 0.1 | 0.02 | 0.055 | 63.3 |
| 66 | 300 | 0.1 | 0.02 | 0.08 | 63.3 |
| 67 | 300 | 0.1 | 0.05 | 0.03 | 66.4 |
| 68 | 300 | 0.1 | 0.05 | 0.055 | 64.8 |
| 69 | 300 | 0.1 | 0.05 | 0.08 | 64.7 |
| 70 | 300 | 0.1 | 0.1 | 0.03 | 60.7 |
| 71 | 300 | 0.1 | 0.1 | 0.055 | 58.5 |
| 72 | 300 | 0.1 | 0.1 | 0.08 | 58.3 |
| 73 | 300 | 0.2 | 0.02 | 0.03 | 108.1 |
| 74 | 300 | 0.2 | 0.02 | 0.055 | 104.6 |
| 75 | 300 | 0.2 | 0.02 | 0.08 | 103.5 |
| 76 | 300 | 0.2 | 0.05 | 0.03 | 119.1 |
| 77 | 300 | 0.2 | 0.05 | 0.055 | 114.7 |
| 78 | 300 | 0.2 | 0.05 | 0.08 | 113.3 |
| 79 | 300 | 0.2 | 0.1 | 0.03 | 115.7 |
| 80 | 300 | 0.2 | 0.1 | 0.055 | 111.0 |
| 81 | 300 | 0.2 | 0.1 | 0.08 | 109.6 |

Next, the evaluation factors are set to be three factors of (v) the thickness of the protective film, (vi) the modulus of elasticity of the protective film, and (vii) a design condition of the semiconductor device based on the experimental results of the above-stated (i) to (iv) factors, and the factorial experiments based on a two-level L81 orthogonal array for (v), and each three-level L81 orthogonal array for (vi) and (vii) are performed. The three levels for (vii) are Best (No. 57 in Table 1), Medium (No. 41 in Table 1), and Worst (No. 25 in Table 1). Results are as represented in Table 2, and as a result of the analysis of variance, it turns out that it is advantageous as (v) the thickness of the protective film is thicker, (vi) the modulus of elasticity of the protective film is smaller to reduce the stress applied on the surface of the semiconductor chip just under the filler particle, and effects of (v) and (vi) are large as the factor of (vii) is Worst.

TABLE 2

| No. | DESIGN CONDITIONS | THICKNESS OF PROTECTIVE FILM [mm] | MODULUS OF ELASTICITY OF PROTECTIVE FILM [MPa] | STRESS [MPa] |
|---|---|---|---|---|
| 1 | worst | 0.005 | 3000 | 279.6 |
| 2 | worst | 0.005 | 1000 | 220.9 |
| 3 | worst | 0.005 | 500 | 180.6 |
| 4 | worst | 0.01 | 3000 | 163.8 |
| 5 | worst | 0.01 | 1000 | 131.6 |
| 6 | worst | 0.01 | 500 | 105.0 |
| 7 | medium | 0.005 | 3000 | 98.9 |
| 8 | medium | 0.005 | 1000 | 80.6 |
| 9 | medium | 0.005 | 500 | 66.7 |
| 10 | medium | 0.01 | 3000 | 52.8 |
| 11 | medium | 0.01 | 1000 | 43.1 |
| 12 | medium | 0.01 | 500 | 35.4 |
| 13 | best | 0.005 | 3000 | 23.4 |
| 14 | best | 0.005 | 1000 | 17.6 |
| 15 | best | 0.005 | 500 | 14.5 |
| 16 | best | 0.01 | 3000 | 14.3 |
| 17 | best | 0.01 | 1000 | 12.6 |
| 18 | best | 0.01 | 500 | 11.9 |

Based on the above-stated experimental results, (iii) the thickness of the second-stage semiconductor chip is fixed to be 100 μm, (iv) the thickness of the first-stage semiconductor chip is fixed to be 80 μm. The above-stated (i), (ii), (v), and (vi) are set to be the evaluation factors, and the factorial experiments based on each three-level L81 orthogonal array are performed. The three levels of each factor are as follows.

(i) The modulus of elasticity of the adhesive layer: 10 [MPa], 50 [MPa], 300 [MPa]

(ii) The sink amount of the adhesive layer: 0.02 [mm], 0.1 [mm], 0.2 [mm]

(v) The thickness of the protective film: 0.005 [mm], 0.0065 [mm], 0.01 [mm]

(vi) The modulus of elasticity of the protective film: 500 [MPa], 1000 [MPa], 3000 [MPa]

Results are as represented in Table 3, and as a result of the analysis of variance, the similar effect as the former experimental result is shown as for each factor.

TABLE 3

| No. | MODULUS OF ELASTICITY OF ADHESIVE LAYER [MPa] | SINK AMOUNT OF ADHESIVE LAYER [mm] | THICKNESS OF PROTECTIVE FILM [mm] | MODULUS OF ELASTICITY OF PROTECTIVE FILM [MPa] | STRESS [MPa] |
|---|---|---|---|---|---|
| 1 | 10 | 0.02 | 0.005 | 500 | 131.5 |
| 2 | 10 | 0.02 | 0.005 | 1000 | 175.5 |
| 3 | 10 | 0.02 | 0.005 | 3000 | 234.5 |
| 4 | 10 | 0.02 | 0.0065 | 500 | 105.8 |
| 5 | 10 | 0.02 | 0.0065 | 1000 | 142.0 |
| 6 | 10 | 0.02 | 0.0065 | 3000 | 190.0 |
| 7 | 10 | 0.02 | 0.01 | 500 | 71.8 |
| 8 | 10 | 0.02 | 0.01 | 1000 | 97.4 |
| 9 | 10 | 0.02 | 0.01 | 3000 | 131.7 |
| 10 | 10 | 0.1 | 0.005 | 500 | 151.1 |
| 11 | 10 | 0.1 | 0.005 | 1000 | 193.2 |
| 12 | 10 | 0.1 | 0.005 | 3000 | 250.7 |
| 13 | 10 | 0.1 | 0.0065 | 500 | 123.6 |
| 14 | 10 | 0.1 | 0.0065 | 1000 | 159.1 |
| 15 | 10 | 0.1 | 0.0065 | 3000 | 205.7 |
| 16 | 10 | 0.1 | 0.01 | 500 | 85.2 |
| 17 | 10 | 0.1 | 0.01 | 1000 | 111.7 |
| 18 | 10 | 0.1 | 0.01 | 3000 | 144.3 |
| 19 | 10 | 0.2 | 0.005 | 500 | 179.4 |
| 20 | 10 | 0.2 | 0.005 | 1000 | 219.3 |
| 21 | 10 | 0.2 | 0.005 | 3000 | 277.5 |
| 22 | 10 | 0.2 | 0.0065 | 500 | 149.2 |
| 23 | 10 | 0.2 | 0.0065 | 1000 | 183.8 |
| 24 | 10 | 02 | 0.0065 | 3000 | 230.9 |
| 25 | 10 | 0.2 | 0.01 | 500 | 105.3 |
| 26 | 10 | 0.2 | 0.01 | 1000 | 132.0 |
| 27 | 10 | 0.2 | 0.01 | 3000 | 164.3 |
| 28 | 50 | 0.02 | 0.005 | 500 | 41.9 |
| 29 | 50 | 0.02 | 0.005 | 1000 | 62.2 |
| 30 | 50 | 0.02 | 0.005 | 3000 | 98.6 |
| 31 | 50 | 0.02 | 0.0065 | 500 | 31.6 |
| 32 | 50 | 0.02 | 0.0065 | 1000 | 47.1 |
| 33 | 50 | 0.02 | 0.0065 | 3000 | 76.7 |
| 34 | 50 | 0.02 | 0.01 | 500 | 20.4 |
| 35 | 50 | 0.02 | 0.01 | 1000 | 29.5 |
| 36 | 50 | 0.02 | 0.01 | 3000 | 49.8 |
| 37 | 50 | 0.1 | 0.005 | 500 | 66.6 |
| 38 | 50 | 0.1 | 0.005 | 1000 | 91.0 |
| 39 | 50 | 0.1 | 0.005 | 3000 | 129.3 |
| 40 | 50 | 0.1 | 0.0065 | 500 | 51.6 |
| 41 | 50 | 0.1 | 0.0065 | 1000 | 71.5 |
| 42 | 50 | 0.1 | 0.0065 | 3000 | 102.6 |
| 43 | 50 | 0.1 | 0.01 | 500 | 33.1 |
| 44 | 50 | 0.1 | 0.01 | 1000 | 46.4 |
| 45 | 50 | 0.1 | 0.01 | 3000 | 68.1 |
| 46 | 50 | 0.2 | 0.005 | 500 | 98.6 |
| 47 | 50 | 0.2 | 0.005 | 1000 | 128.4 |
| 48 | 50 | 0.2 | 0.005 | 3000 | 169.1 |
| 49 | 50 | 0.2 | 0.0065 | 500 | 79.8 |
| 50 | 50 | 0.2 | 0.0065 | 1000 | 104.3 |
| 51 | 50 | 0.2 | 0.0065 | 3000 | 136.6 |
| 52 | 50 | 0.2 | 0.01 | 500 | 54.0 |
| 53 | 50 | 0.2 | 0.01 | 1000 | 70.8 |
| 54 | 50 | 0.2 | 0.01 | 3000 | 93.2 |
| 55 | 300 | 0.02 | 0.005 | 500 | 11.8 |
| 56 | 300 | 0.02 | 0.005 | 1000 | 14.0 |
| 57 | 300 | 0.02 | 0.005 | 3000 | 22.3 |
| 58 | 300 | 0.02 | 0.0065 | 500 | 11.4 |
| 59 | 300 | 0.02 | 0.0065 | 1000 | 12.5 |
| 60 | 300 | 0.02 | 0.0065 | 3000 | 17.4 |
| 61 | 300 | 0.02 | 0.01 | 500 | 12.0 |
| 62 | 300 | 0.02 | 0.01 | 1000 | 12.1 |
| 63 | 300 | 0.02 | 0.01 | 3000 | 13.6 |
| 64 | 300 | 0.1 | 0.005 | 500 | 26.0 |
| 65 | 300 | 0.1 | 0.005 | 1000 | 37.2 |
| 66 | 300 | 0.1 | 0.005 | 3000 | 60.4 |
| 67 | 300 | 0.1 | 0.0065 | 500 | 20.7 |
| 68 | 300 | 0.1 | 0.0065 | 1000 | 28.6 |
| 69 | 300 | 0.1 | 0.0065 | 3000 | 46.6 |
| 70 | 300 | 0.1 | 0.01 | 500 | 16.0 |
| 71 | 300 | 0.1 | 0.01 | 1000 | 19.6 |
| 72 | 300 | 0.1 | 0.01 | 3000 | 30.1 |
| 73 | 300 | 0.2 | 0.005 | 500 | 63.4 |
| 74 | 300 | 0.2 | 0.005 | 1000 | 83.2 |
| 75 | 300 | 0.2 | 0.005 | 3000 | 114.9 |
| 76 | 300 | 0.2 | 0.0065 | 500 | 50.5 |
| 77 | 300 | 0.2 | 0.0065 | 1000 | 66.4 |
| 78 | 300 | 0.2 | 0.0065 | 3000 | 91.8 |
| 79 | 300 | 0.2 | 0.01 | 500 | 34.2 |
| 80 | 300 | 0.2 | 0.01 | 1000 | 44.4 |
| 81 | 300 | 0.2 | 0.01 | 3000 | 61.5 |

Besides, it is possible to represent the stress "y" [MPa] applied on the surface of the semiconductor chip just under the filler particle by a function:

$$y = f(a1, a2, a3, a4)$$

by performing a regression analysis of the results. Here, "a1" is a logarithm of the modulus of elasticity [MPa] of the adhesive layer, "a2" is the sink amount [mm] of the adhesive layer, "a3" is the thickness [mm] of the protective film at the surface of the first-stage semiconductor chip, and "a4" is a logarithm of the modulus of elasticity [MPa] of the protective film at the surface of the first-stage semiconductor chip.

A result of the regression analysis according to a multiple regression is represented below.

$$y = 74.7 - 82.7a1 + 273.2a2 - 9882a3 + 65.8a4 \quad (1)$$

This $R^2$ is 89.4%. Besides, "a1", "a2", "a3", "a4" are respectively $1.00 \leq a1 \leq 2.48$, $0.02 \leq a2 \leq 0.2$, $0.005 \leq a3 \leq 0.01$, and $2.70 \leq a4 \leq 3.48$.

Next, an experiment finding the threshold value generating the filler attack of the stress applied on the surface of the semiconductor chip just under the filler particle is performed.

In the experiment, five kinds of semiconductor devices (example 1 to example 5) of which moduli of elasticity of the adhesive layer are different are manufactured by changing a curing time of the adhesive layer when the second-stage semiconductor chip is stacked on the first-stage semiconductor chip to examine the occurrence of the filler attack.

A semiconductor chip with a thickness of 70 μm having a protective film composed of a polyimide resin of which thickness is 5 μm and modulus of elasticity is 3 GPa at a surface thereof is used as the first-stage semiconductor chip, and a semiconductor chip of which thickness is 55 μm is used as the second-stage semiconductor chip. The adhesive layer is formed by coating and drying an epoxy resin being a liquid thermosetting resin for a thickness of 10 μm by a screen printing. The sinks (maximum values) of the adhesive layers are each 65 μm. A sealing epoxy resin is used for the molding resin, and it is heat cured under a pressure-dwelling condition of 8 MPa. Results are as represented in Table 4, and it turns out that the filler attack does not occur when the modulus of elasticity of the adhesive layer is 92 MPa or more. The filler attack does not occur when the modulus of elasticity of the adhesive layer is 20 MPa, but it is because the sink does not exist resulting from a fillet formed at an end part of the adhesive layer caused by incompletion of the curing. The filler attack occurs when the modulus of elasticity of the adhesive layer is 238 MPa, but it is conceivable that the surface of the first-stage semiconductor chip is damaged by the filler particle as a result of a deformation of the semiconductor chip at a gap formed at a detached part (gap) with a height of 4.7 μm between the adhesive layer at a rear surface of the first-stage semiconductor chip and the substrate.

TABLE 4

| | ADHESIVE LAYER | | | |
| | | MODULUS OF ELASTICITY | NUMBER OF FILLER ATTACKS | |
| CURING CONDITIONS | | (MPa) | Sample 1 | Sample 1 |
| --- | --- | --- | --- | --- |
| No. 1 | 150° C. × 8 min | 20 | 0 | 0 |
| No. 2 | 150° C. × 20 min | 56 | 5 | 5 |
| No. 3 | 150° C. × 50 min | 92 | 0 | 0 |
| No. 4 | 150° C. × 1 h + 175° C. × 1 hr | 130 | 0 | 0 |
| No. 5 | 150° C. × 1 h + 175° C. × 8 min | 238 | 1 | 1 |

Based on the above-stated experimental results, the experimental conditions are reproduced by a simulation model to perform the stress analysis according to the finite element method. Namely, in the simulation model, the first-stage semiconductor chip has (thickness: 70 μm, modulus of elasticity: 166.7 GPa), the second-stage semiconductor chip has (thickness: 55 μm, modulus of elasticity: 166.7 GPa), the adhesive layer has (thickness: 10 μm, sink: 65 μm, modulus of elasticity: 92 MPa), and the spherical filler particle has (diameter: 10 μm). The spherical filler particle positions at 10 μm from the end part of the sink of the adhesive layer, and the protective film at the surface of the first-stage semiconductor chip has the modulus of elasticity of 3 GPa, and the thickness of 5 μm. The pressure-dwelling condition is 8 MPa. As a result of the analysis, the stress applied on the surface of the semiconductor chip just under the filler particle is 70 MPa.

It can be said that it is possible to prevent the occurrence of the filler attack when the value of "y" in the above-stated formula (1) is 70 or less from the results. Namely, in a multi stack mold sealing type semiconductor device having a structure in which the second semiconductor chip is stacked on the first semiconductor chip via the adhesive layer, and these semiconductor chips are sealed by the molding resin with fillers, the stress "y" [MPa] applied on the surface of the semiconductor chip just under the filler particle can be represented as the function of the logarithm "a1" of the modulus of elasticity [MPa] of the adhesive layer 5, the sink amount [mm] "a2" of the adhesive layer 5, the thickness [mm] "a3" of the protective film at the surface of the first semiconductor chip 2, and the logarithm "a4" of the modulus of elasticity [MPa] of the protective film at the surface of the first semiconductor chip 2 (note that "a1", "a2", "a3", "a4" are respectively $1.00 \leq a1 \leq 2.48$, $0.02 \leq a2 \leq 0.2$, $0.005 \leq a3 \leq 0.01$, and $2.70 \leq a4 \leq 3.48$), and the filler attack does not occur if $y \leq 70$.

As it is described hereinabove, according to the present embodiment, it is possible to surely prevent the occurrence of the filler attack in the multi stack mold sealing type semiconductor device manufactured by using the semiconductor chips with the "sink" at the adhesive layer because it is manufactured by adjusting to be the condition in which the filler attack does not occur based on the formula (1). In addition, it is not necessary to use expensive and peculiar materials or to use complicated manufacturing processes, and it is possible to implement easily and economically because the adjustment can be performed by using the modulus of elasticity of the adhesive layer, and the thickness and the modulus of elasticity of the protective film of the semiconductor chip.

Besides, it is possible to easily correspond to changes of materials of the adhesive layer and the protective film, and to manufacture a high-quality semiconductor device without any filler attack with high yield and low cost.

EXAMPLES

Examples are described.

Example 1

A two-stage stacked semiconductor device as illustrated in FIG. 1 was manufactured by using a semiconductor chip in which a protective film composed of a polyimide resin of which thickness is 0.005 mm, modulus of elasticity is 3000 ($=10^{3.48}$) MPa was formed at a surface as a first-stage semiconductor chip. The molding temperature of the molding resin was 180° C. (±5° C.).

Figure 4:
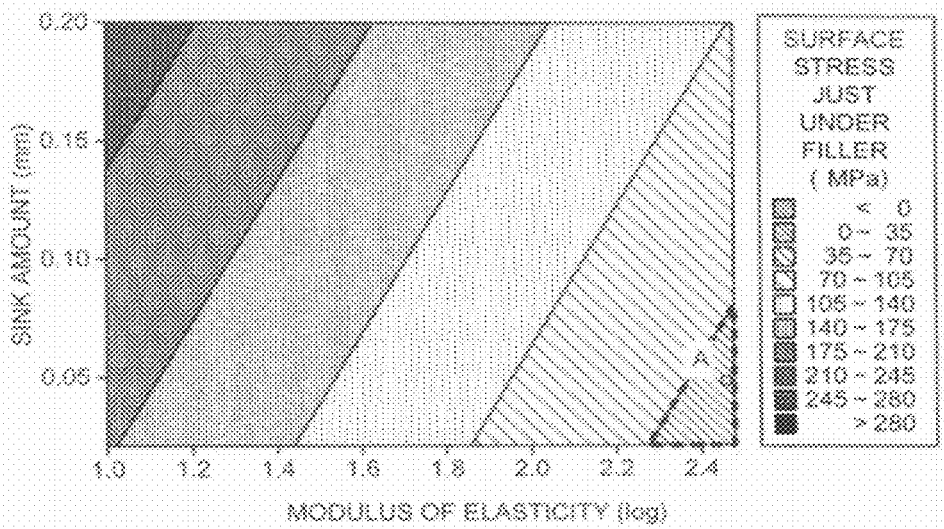
FIG. 4 is a contour map of "y" (a surface stress of a semiconductor chip just under a filler particle) in an example 1.

When it was manufactured, a contour map (X axis: a1 (the logarithm of the modulus of elasticity of the adhesive layer), Y axis: a2 (the sink amount of the adhesive layer)) of "y" when a3=0.005, a4=3.48 as illustrated in FIG. 4 was prepared based on the above-stated formula (1). A range surrounded by a black dotted line of the contour map was the range of $y \leq 70$.

The sink amount of the adhesive layer formed at a rear surface of a semiconductor chip used as the second-stage semiconductor chip was 0.05 mm, and therefore, the semiconductor device was manufactured while adjusting the curing conditions such that the logarithm of the modulus of elasticity of the adhesive layer was within a range, specifically, 2.48 (the modulus of elasticity of 300 MPa) (a point A in FIG. 4) by finding a range of "a1" in which the sink amount of the adhesive layer is 0.05 mm within the range surrounded by the black dotted line.

The filler attack did not exist at the manufactured semiconductor device, and it had fine properties. The values of "y" and "a1" to "a4" at the semiconductor device were as follows.

a1=2.48 (the modulus of elasticity of the adhesive layer: 300 MPa)

a2=0.05 (the sink amount of the adhesive layer: 0.05 mm)

a3=0.005 (the thickness of the protective film: 0.005 mm)

a4=3.48 (the modulus of elasticity of the protective film: 3000 MPa)

y=62.9 (the surface stress of the semiconductor chip just under the filler particle)

Example 2

A two-stage stacked semiconductor device as illustrated in FIG. 1 was manufactured by using a semiconductor chip in which a protective film composed of a polyimide resin of which thickness was 0.01 mm, modulus of elasticity is 3000 ($=10^{3.48}$) MPa was formed at a surface as a first-stage semiconductor chip. The molding temperature of the molding resin is 180° C. (±5° C.).

Figure 5:
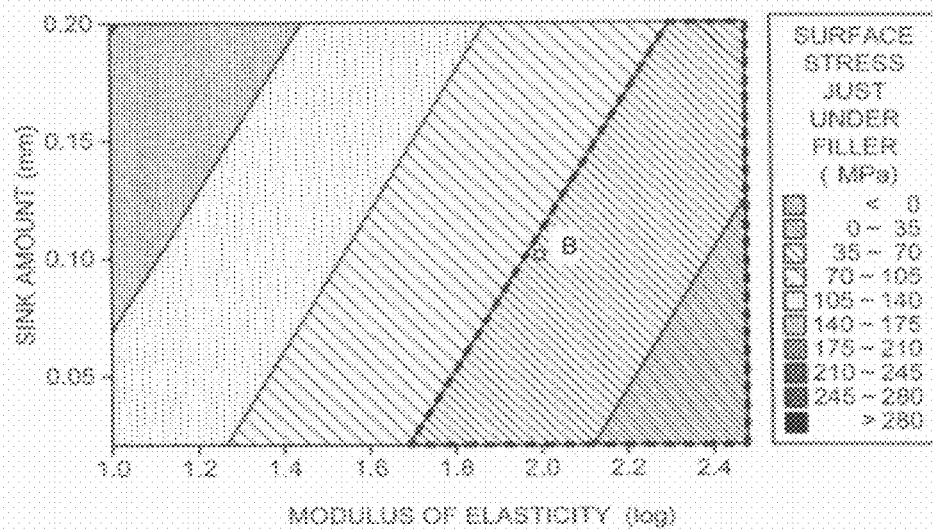
FIG. 5 is a contour map of "y" (a surface stress of a semiconductor chip just under a filler particle) in an example 2.

When it was manufactured, a contour map (X axis: a1 (the logarithm of the modulus of elasticity of the adhesive layer), Y axis: a2 (the sink amount of the adhesive layer)) of "y" when a3=0.01, a4=3.48 as illustrated in FIG. 5 was prepared based on the above-stated formula (1). A range surrounded by a black dotted line of the contour map was the range of $y \leq 70$.

The sink amount of the adhesive layer formed at a rear surface of a semiconductor chip used as the second-stage semiconductor chip was 0.1 mm, and therefore, the semiconductor device was manufactured while adjusting the curing conditions such that the logarithm of the modulus of elasticity of the adhesive layer was within a range, specifically, 2.00 (the modulus of elasticity of 200 MPa) (a point B in FIG. 5) by finding the range of "a1" in which the sink amount of the adhesive layer was 0.1 mm within the range surrounded by the black dotted line.

The filler attack was not recognized at the manufactured semiconductor device, and it had fine properties. The values of "y" and "a1" to "a4" at the semiconductor device were as follows.

a1=2.00 (the modulus of elasticity of the adhesive layer: 100 MPa)

a2=0.1 (the sink amount of the adhesive layer: 0.1 mm)

a3=0.01 (the thickness of the protective film: 0.01 mm)

a4=3.48 (the modulus of elasticity of the protective film: 3000 MPa)

y=66.6 (the surface stress of the semiconductor chip just under the filler particle)

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first semiconductor chip;
a second semiconductor chip stacked on the first semiconductor chip via an adhesive layer; and
a molding resin with filler particles sealing the first and second semiconductor chips, wherein a value of "y" corresponds to an approximation of stress applied on the surface of the semiconductor chip under the filler particles and is 70 or less, the value of "y" being calculated on the basis of the following formula (1):

$$y = 74.7 - 82.7a_1 + 273.2a_2 - 9882a_3 + 65.8a_4 \quad (1)$$

where a1 represents a logarithm of the modulus of elasticity [MPa] of the adhesive layer, a2 represents the sink amount [mm] of the adhesive layer, a3 represents the thickness [mm] of a protective film at the surface of the first semiconductor chip, and a4 represents a logarithm of the modulus of elasticity [MPa] of the protective film at the surface of the first semiconductor chip.

2. The semiconductor device according to claim 1, wherein the "a1", "a2", "a3", and "a4" are respectively $1.00 \leq a_1 \leq 2.48$, $0.02 \leq a_2 \leq 0.2$, $0.005 \leq a_3 \leq 0.01$, and $2.70 \leq a_4 \leq 3.48$.

3. The semiconductor device according to claim 1, wherein the first semiconductor chip comprises a passivation film disposed directly below the protective film.

4. The manufacturing method of the semiconductor device according to claim 1, wherein the adhesive layer comprises a liquid thermosetting resin.

5. The semiconductor device according to claim 1, wherein the adhesive layer comprises a polyimide resin.

* * * * *